United States Patent [19]

Le Roux et al.

[11] Patent Number: 5,414,295
[45] Date of Patent: May 9, 1995

[54] AVALANCE DIODE INCORPORATED IN A BIPOLAR INTEGRATED CIRCUIT

[75] Inventors: Gérard Le Roux, Sappey-en-Chartreuse; Jacques Le Menn, Grenoble, both of France

[73] Assignee: SGS-Thomson Microelectronics S.A., Gentilly, France

[21] Appl. No.: 202,919

[22] Filed: Feb. 28, 1994

[30] Foreign Application Priority Data

Mar. 1, 1993 [FR] France ................. 93 02617

[51] Int. Cl.$^6$ .................. H01L 29/72; H01L 29/90
[52] U.S. Cl. .................... 257/577; 257/605; 257/606; 257/653
[58] Field of Search ............... 257/577, 603, 605, 606, 257/653

[56]           References Cited
U.S. PATENT DOCUMENTS 4,651,178  3/1987  Avery ................. 357/13

FOREIGN PATENT DOCUMENTS 0017022  10/1980  European Pat. Off. ...... H01L 29/90
0232589   8/1987  European Pat. Off. ...... H01L 29/90
0314399   5/1989  European Pat. Off. ...... H01L 29/90
0521802   1/1993  European Pat. Off. ...... H01L 29/90

OTHER PUBLICATIONS

Patent Abstracts of Japan, vol. 010, No. 019, Publication No. JP60171515, May 9, 1985.

*Primary Examiner*—Ngân V. Ngô
*Attorney, Agent, or Firm*—Wolf, Greenfield & Sacks

[57]                   ABSTRACT

A reference diode is formed in an N-type insulated well. An avalanche diode includes a P-type deep region having a high doping level, beneath which is formed an N-type overlapping buried layer, a P-type deep diffused region contacting a central portion of the deep region, a second, P-type, deep diffused region contacting the periphery of the deep region, an N-type highly doped surface region coating the surface of the first deep diffused region and forming therewith an avalanche junction. At least another structure identical to the avalanche diode structure, without the N-type surface region, forms a resistor between its electrodes.

12 Claims, 2 Drawing Sheets

AVALANCE DIODE INCORPORATED IN A BIPOLAR INTEGRATED CIRCUIT

BACKGROUND OF THE INVENTION

1. Field of the Invention

The present invention relates to bipolar integrated circuits, and more particularly to the fabrication of avalanche diodes for use as a reference voltage in such circuits.

2. Discussion of the Related Art

Avalanche diodes have been studied for a long time, and it is known, when fabricating discrete components, how to obtain satisfactory avalanche diodes. However, in the manufacture of integrated circuits, many constraints are imposed, i.e., a large number of elemental components are simultaneously fabricated and all these components have to be made using as few technological steps as possible.

So, generally, when it is desired to manufacture a buried avalanche diode isolated from the substrate, the resulting component corresponds to the equivalent schematic diagram shown in FIG. 1. This component comprises a first avalanche diode Z1 in series with a resistor R1. A second diode Z2 is disposed in parallel with the serial connection of diode Z1 and resistor R1.

In practice, resistor R1 has often a non-negligible value, for example, approximately 400–1000 Ω. Additionally, normally, diode Z2, that has an avalanche threshold higher than the avalanche threshold of diode Z1, does not conduct. However, when the avalanche current in diode Z1 increases, the voltage drop in resistor R1 increases, and when the voltage drop exceeds the difference in the avalanche voltages between diodes Z2 and Z1, diode Z2 may also avalanche.

These various drawbacks can be avoided by providing specific doping levels for the various layers forming the avalanche diode. However, when this is done, the technological manufacturing process is complicated and it is no longer possible to use conventional technologies.

European patent applications 0,314,399 and 0,017,022 disclose avalanche diodes that have a very high avalanche voltage, 100 volts or more, while the diode Z1 has an avalanche voltage of approximately 6 volts. Thus, the parasitic diode Z2 cannot be made conductive.

Despite this advantage, the diodes according to the above-noted European patent applications still have some drawbacks. As pointed out above, the manufacturing process of such a diode uses only the technological steps that are already used for the fabrication of a conventional integrated circuit. Thus, the various doping levels of this diode are imposed by technological constraints and are not optimized for this diode. Therefore, the series resistor R1 of the diode, can be approximately 100–400 Ω. Moreover, the diode has a temperature coefficient, that is, a variation of its breakdown voltage as a function of temperature, that is approximately 2.8 mV/° C. These two characteristics (internal resistance and non-negligible temperature coefficient) are major drawbacks for the fabrication of a reference diode whose voltage should be accurately determined, whatever the current flow and the temperature of the integrated circuit is.

Since these two drawbacks appear, to a variable extent, in all the conventional avalanche diodes, it has been devised in the prior art to form, using an avalanche diode, circuits for supplying a reference voltage that is compensated for current and temperature variations. An example of such a circuit is illustrated in FIG. 2. This circuit is connected to the terminals of a supply voltage source, for example, between a positive voltage supply terminal Vcc and ground G. In this circuit, a first branch is formed by the serial connection of a current source I and an NPN transistor T1. A second branch includes the serial connection of an NPN transistor T2, an avalanche diode (represented in the form of an ideal avalanche diode Z in series with an internal resistor RZ), and a resistor R. The base of transistor T2 is connected to the collector of transistor T1, and the base of transistor T1 is connected to the junction between the avalanche diode Z-RZ and resistor R. The desired reference voltage Vr is provided at the terminals of the serial connection of the avalanche diode with resistor R, that is, between the emitter of transistor T2 and ground G. If Vbe is the base-emitter voltage of transistor T1, the reference voltage is given by the following equation:

$$Vr = Vz + Vbe + RzIz.$$

where Iz is the current flowing through the avalanche diode.

Since the base current of transistor T7 is low with respect to current Iz, one has:

$Iz = Vbe/R$, whereby:

$Vr = Vz + Vbe + Vbe(Rz/R)$, that is:

$Vr = Vz + Vbe(1 + Rz/R)$.

As can be seen, the reference voltage depends upon the ratio between the resistance of the series resistor Rz of the avalanche diode and the resistance of the resistor R that defines the current in this diode. Rz generally being non-negligible with respect to R, the absolute value of the reference voltage is subject to the variations of ratio Rz/R as well as to temperature variations, with a resulting poor reproducibility of this reference voltage.

SUMMARY OF THE INVENTION

Thus, an object of the invention is to provide a new reference diode structure that can be used in a bipolar integrated circuit and that does not require manufacturing steps other than those conventionally provided for a bipolar integrated circuit.

Another object of the invention is to provide a reference current and temperature compensated reference diode.

More particularly, the invention proposes a specific implementation of resistor R to ensure that the Rz/R ratio remains insensitive to manufacturing variations.

To achieve these objects, the invention provides a reference diode formed in an insulated well of a first conductivity type epitaxial layer that coats a substrate of a second conductivity type. This reference diode comprises:

on the one hand, an avalanche diode including, at the bottom of the well, a highly doped deep region of the second conductivity type, beneath which is formed an overlapping buried layer of the first conductivity type; a first deep diffused region of the second conductivity type contacting a central portion of the deep region; a second deep diffused region of the second conductivity type contacting the periphery of the deep region; a surface region of the first conductivity type having a high doping level coating the surface of the first deep diffused region and forming therewith an avalanche junction; a first electrode contacting the surface of the surface region; and a second electrode contacting the surface of the second deep diffused region; on the other hand, in the same well, at least one additional structure identical to the structure of this diode, but without the first conductivity type surface region, the first electrode being then in contact with the upper surface of the first deep diffused region. The additional structure forms between its first and second electrodes a resistor, and means are provided to serially connect the diode to the resistor(s).

According to an embodiment of the invention, the second deep diffused region is annular.

According to an embodiment of the invention, the insulation of the well is ensured by the contact of a base of the second conductivity type formed in the substrate with a third deep diffusion step of the second conductivity type extending from the external surface of the epitaxial layer, said deep region being of the same nature as the base.

The invention also provides a reference diode, including, between a high supply source and ground, a first branch formed by the serial connection of a current source to a transistor, a second branch comprising the serial connection of a second transistor and of the above-mentioned avalanche diode and resistor(s), means for connecting the base of the second transistor to the emitter of the first transistor, and means for connecting the base of the first transistor to the junction of the avalanche diode and the resistor(s).

The foregoing and other objects, features, aspects and advantages of the invention will become apparent from the following detailed description of the present invention when taken in conjunction with the accompanying drawings.

As is conventional in integrated circuit representation, it will be noted that the various drawings are schematic and are not drawn to scale. In particular, the edges of the junctions are represented without taking into account that they are rounded up following diffusion steps.

DETAILED DESCRIPTION

Figure 3A:
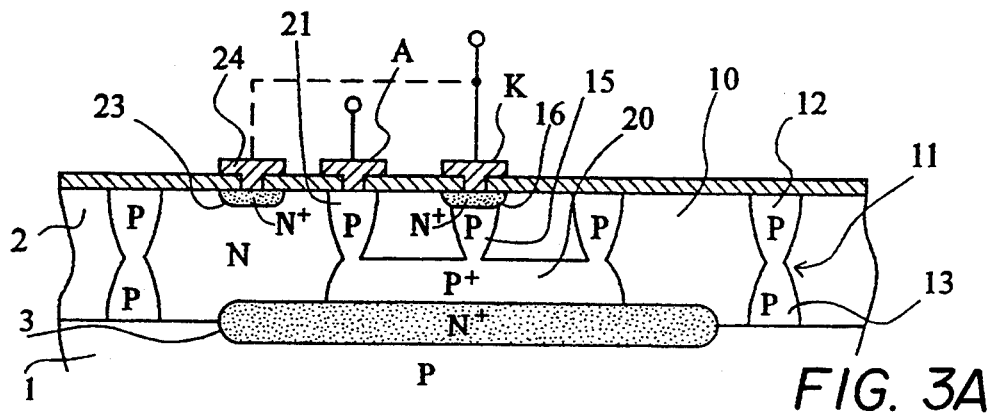
FIGS. 3A and 3B are a cross-sectional view and a hop view, respectively, of an embodiment of an avalanche diode used in the invention.
Figure 3B:
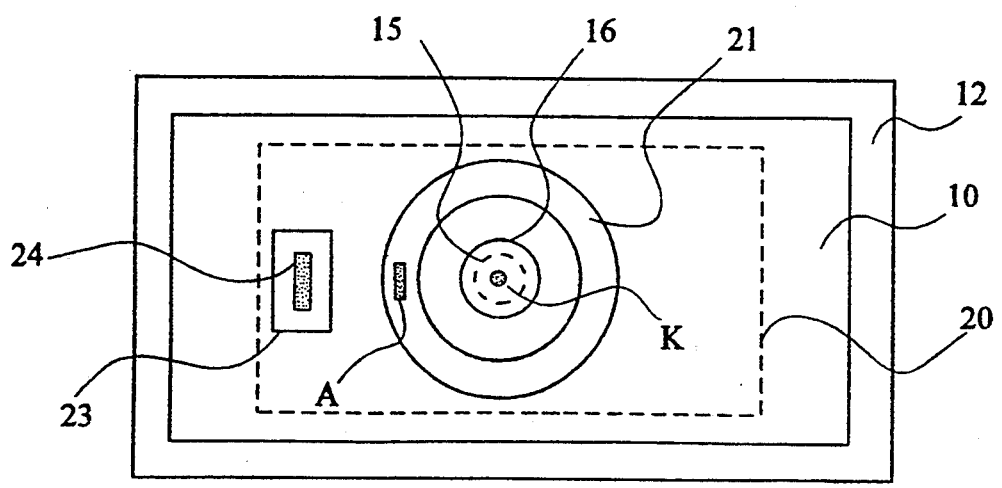

As represented in FIGS. 3A and 3B, the invention uses an avalanche diode formed according to a bipolar circuit technology including an N-type epitaxial layer 2 coating a P-type substrate 1. More particularly, the avalanche diode is formed in a well 10 of the epitaxial layer 2, the well being laterally delineated by a P-type insulating wall 11 and having a base corresponding to an N-type buried layer 3. The insulating wall 11 is formed by the contact of a deep diffused region 12 descending from the surface of the epitaxial layer 2 and by a diffused region 13 rising from a P-type base that is initially formed at the surface of substrate 1 prior to the fabrication of the epitaxial layer 2.

The active junction of the avalanche diode is formed by the junction between a P-type deep descending diffused region 15 with an N-type highly doped surface region 16. Region 16, outside its junction with the P-type diffused region 15, is surrounded by an N-type flow doped region corresponding to the epitaxial layer.

The contact with the N+-type region 16 is taken, through a cathode metallization K. The contact with the P-type region 15 is taken through a highly doped P-type deep diffused region 20 corresponding to an ascending diffused region that is formed from a P-type base implanted in the substrate over the N+-type buried layer 3. The P-type base is formed simultaneously with the bases of the insulating ascending diffused regions 13. Then, deep diffused regions 21 are formed from the surface of the epitaxial layer and contact the deep diffused region 20. The diffused regions 21 are formed simultaneously with the diffused regions 12 and 15. An anode metallization A contacts the upper portion of the diffused region 21.

When a bipolar integrated circuit component is fabricated in a well, the well is conventionally biased so as to be junction insulated from the substrate. Thus, the N-type well 10 must be positively biased. This is achieved by forming an N-type highly doped region 23 in a portion of the upper surface of well 10, region 23 being in contact with a metallization 24 connected to a voltage that is higher than the voltage to which substrate 1 is connected. Since the diode operates as an avalanche diode, its terminal K is normally connected to a higher voltage than its terminal A, and metallization 24 can be connected to terminal K.

FIG. 3B is a schematic top view corresponding to FIG. 3A; portions identical to those of FIG. 3A are labelled with same reference numerals. It should be noted that region 21 that provides contact with the deep diffused region 20 is preferably a circular region completely surrounding the N+-type cathode region 16.

Figure 1:
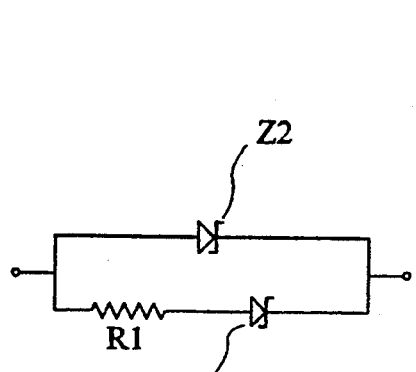
FIG. 1 schematically represents an equivalent diagram of a conventional buried insulated avalanche diode.
Figure 2:
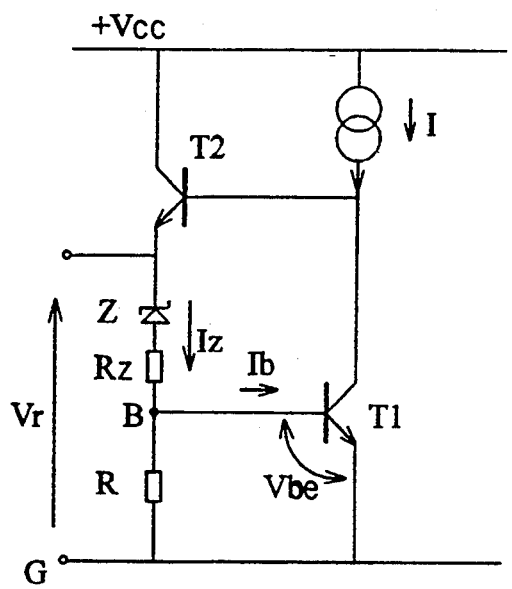
FIG. 2 schematically represents a conventional circuit for supplying a reference voltage.
Figure 4A:
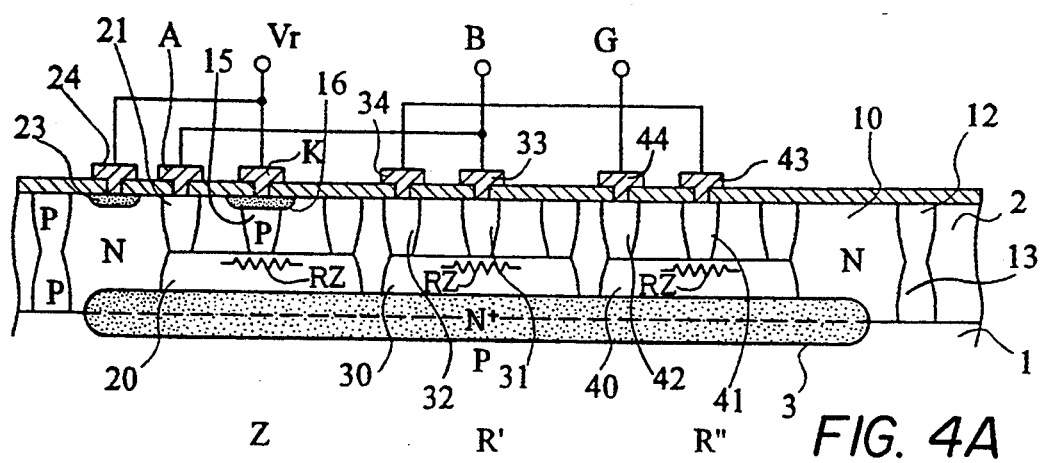
FIGS. 4A and 4B are a cross-sectional view and a top view, respectively, of an avalanche diode combined with resistors to form a reference diode according to the invention.
Figure 4B:
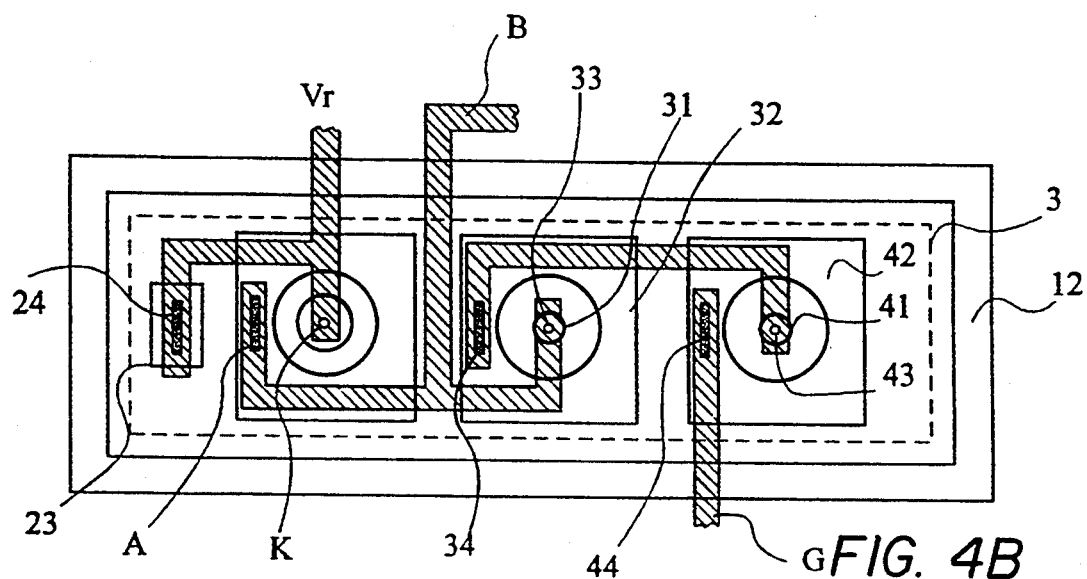

FIGS. 4A and 4B are a cross-sectional view and a top view, respectively, of a combination according to the invention of the above disclosed avalanche diode and resistors for providing the resistor R disclosed in connection with FIG. 2. In these figures, same elements as those of FIGS. 3A and 3B are labelled with same reference numerals.

The left-hand portion of FIGS. 4A and 4B shows again a diode structure strictly identical to the structure of FIG. 3A. In the example of FIG. 4A, this diode structure is repeated twice, without the N+-type diffused region 16, to form two resistor structures R' and R" having substantially the same resistance value Rz as the diode. Resistor R' includes a deep layer 30, a deep central diffused region 31 contacting the deep layer 30 and a deep annular diffused region 32 also contacting this deep layer. A contact 33 is taken from region 31, and a contact 34 is taken from the surface of ring 32. Similarly, the second resistor R" includes corresponding regions 40, 41, 42, 43, and 44. Terminal A of the diode is connected to metallization 33 of resistor R' and to the base terminal B of transistor T1. The metallization 34 of resistor R' is connected to the metallization 43 of resistor R" having its metallization 44 connected to the ground terminal G.

The top view of FIG. 4B better illustrates the various metallizations.

Figure 5:
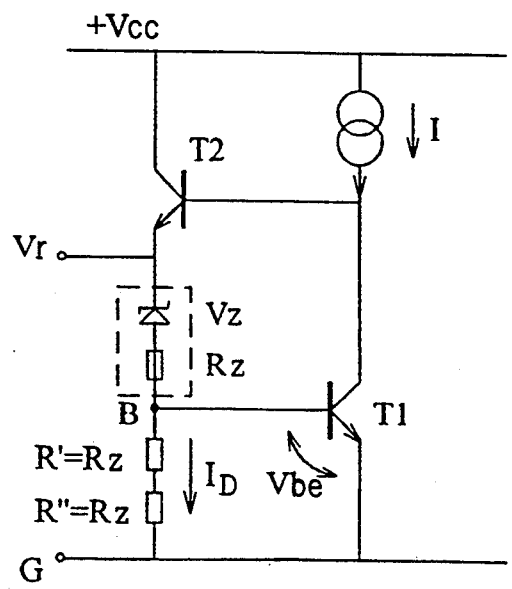
FIG. 5 is an equivalent circuit of a reference diode incorporating the structure of FIGS. 4A and 4B.

FIG. 5 shows the same circuit as the one of FIG. 2 with the addition of resistors R' and R" both having the same value Rz as the series resistor of diode Vz.

With this structure:

$$Vr = Vz + Vbe[1 + Rz/(R' + R'')]$$
$$= Vz + Vbe(1 + Rz/2Rz)$$
$$= Vz + 1.5\ Vbe.$$

Also, it should be noted that a single resistor R, or more than two resistors R, could be provided. However, in order to reduce the temperature variation, it is preferable, with the doping levels used by the applicant, to provide two resistors R'. Then, the temperature variation is:

$$dVr/dT = dVz/dT + 1.5\ dVbe/dT.$$

In the technology used, $dVz/dT = +2.8$ mV/° C., and $dVbe/dT = -2$ mV/° C., whereby:

$$dVr/dT = -0.2\ mV/°\ C.,$$

that is, the temperature variation is substantially completely compensated for. This compensation can be very accurate by choosing the intensity of the current source I as a function of the surface of transistor T1 in order to obtain a predetermined current density in this transistor. Indeed, the temperature ratio of voltage Vbe decreases when the current density in the emitter of transistor T1 increases.

Of course, as is apparent to those skilled in the art, various modifications can be made to the above described embodiments. More particularly, although a top view of a circular structure including a central cathode and an annular anode electrode is represented, this structure can have any other shape. For example, the various regions can be interlocked square regions, rectangular regions, digitized regions, etc.

By way of example, the thickness of the epitaxial layer 2 can be approximately 16 μm. The diffusion depth of the deep diffused regions 12, 21, 31, 32, 41, and 42 can be approximately 6 μm, the diffused region 15 having a doping level at its interface with the N-type region 16 of approximately $3 \times 10^{18}$ atoms/cm$^3$, the N-type region 16 having a doping level of approximately $3 \times 10^{20}$ atoms/cm$^3$. The deep layers 20, 30, 40, and 13 can result from a bore implantation with a dose of $2.5 \times 10^{14}$ atoms/cm$^2$ at an energy of 180 keV.

Referring to FIGS. 4A and 4B, in a specific embodiment, areas 15, 31, and 41 are 10 μm in diameter; areas 21, 32, and 42 are 48 μm in diameter; the external outline of these areas is a square with a 76 μm side length; area 16 is 10 μm in diameter. The avalanche voltage Vz is 6.7 V±250 mV and the resistance of the series resistor Rz is 350 Ω. The resulting reference voltage Vr (FIG. 6) is 7.9 volts±300 mV.

As is apparent to those skilled in the art, various modifications can be made to the above described embodiments; more particularly, some aspects of fabrication are schematically represented. In practice, many usual improvements can be made. For example, the upper surface of the various layers, such as layers 21, 31, 32, 41, and 42, can be overdoped to improve contacts.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A reference diode formed in an insulated well of a first conductivity type epitaxial layer that coats a substrate of a second conductivity; type, comprising:
   an avalanche diode including:
   at the bottom of the insulated well, a second conductivity type deep region having a high doping level, beneath which is formed an overlapping buried layer of the first conductivity type,
   a first deep diffused region of the second conductivity type contacting a central portion of said deep region,
   a second deep diffused region of the second conductivity type contacting a periphery of said deep region,
   a highly doped surface region of the first conductivity type coating a surface of the first deep diffused region and forming therewith an avalanche junction,
   a first electrode contacting a surface of the surface region, and
   a second electrode contacting a surface of the second deep diffused region;
   at least one additional structure identical to the structure of said avalanche diode but without a first conductivity type surface region, a first electrode of the additional structure being in contact with an upper surface of a first deep diffused region of the additional structure, said additional structure forming, between its first and second electrodes, a resistor; and
   means to serially connect the avalanche diode to the resistor(s).

2. The reference diode of claim 1, wherein the first conductivity type is N, and the second conductivity type is P.

3. The reference diode of claim 1, wherein said second deep diffused region is annular.

4. The reference diode of claim 1, wherein the well is insulated, by a third deep diffused region of the second conductivity type extending from an external surface of the epitaxial layer to the substrate of the second conductivity type.

5. A reference diode including between a high supply source and ground:
   a first branch formed by a serial connection of a current source and a first transistor,
   a second branch comprising a serial connection of a second transistor and an avalanche diode,
   means for connecting a base of the second transistor to a collector of the first transistor,
   means for connecting a base of the first transistor with a junction of the avalanche diode and at least one resistor, wherein the avalanche diode includes:

an avalanche diode including:
  at the bottom of an insulated well, a second conductivity type deep region having a high doping level, beneath which is formed an overlapping buried layer of the first conductivity type,
  a first deep diffused region of the second conductivity type contacting a central portion of said deep region,
  a second deep diffused region of the second conductivity type contacting a periphery of said deep region,
  a highly doped surface region of the first conductivity type coating a surface of the first deep diffused region and forming therewith an avalanche junction,
  a first electrode contacting a surface of the surface region, and
  a second electrode contacting a surface of the second deep diffused region;
  at least one additional structure identical to the structure of said avalanche diode but without a first conductivity type surface region, a first electrode being in contact with an upper surface of a first deep diffused region of the at least one additional structure, said additional structure forming, between its first and second electrodes, a resistor; and
  means to serially connect the diode to the resistor(s).

6. The reference diode of claim 5, wherein the first conductivity type is N, and the second conductivity type is P.

7. The reference diode of claim 5, wherein the second deep diffused region is annular.

8. The reference diode of claim 5, wherein the the well is insulated by a third deep diffused region of the second conductivity type extending from an external surface of the epitaxial layer to a substrate of the second conductivity type disposed below the overlapping buried layer.

9. A reference diode formed in an insulated well of a first conductivity type epitaxial layer that coats a substrate of a second conductivity type, comprising:
  an avalanche diode including:
    at the bottom of the insulated-well, a second conductivity type deep region having a first doping level, beneath which is formed an overlapping buried layer of the first conductivity type,
    a first deep diffused region of the second conductivity type contacting a central portion of said deep region,
    a second deep diffused region of the second conductivity type contacting a periphery of said deep region;
    a surface region having a second doping level and being of the first conductivity type coating a surface of the first deep diffused region and forming therewith an avalanche junction;
  at least one additional structure identical to the structure of the avalanche diode but without a first conductivity type surface region, the additional structure forming a resistor between a first deep diffused region of the at least one additional structure and a second deep diffused region of the at least one additional structure; and
  a serial connection between the avalanche diode and the resistor.

10. The reference diode of claim 1, wherein the first conductivity type is N, and the second conductivity type is P.

11. The reference diode of claim 9, wherein the second deep diffused region is annular.

12. The reference diode of claim 9, wherein the well is insulated by a third deep diffused region of the second conductivity type extending from an external surface of the epitaxial layer to the substrate of the second conductivity type.

* * * * *